JUNCTION TYPE SEMICONDUCTOR DEVICE

Original Filed May 21, 1957

Inventors
KAZUO IWAMA
REONA EZAKI
by Hill, Sherman, Meroni, Gross & Simpson Attys 3,054,033

JUNCTION TYPE SEMICONDUCTOR DEVICE

Kazuo Iwama and Reona Ezaki, Tokyo, Japan, assignors to Sony Corporation, a corporation of Japan Original application May 21, 1957, Ser. No. 660,650. Divided and this application Jan. 18, 1960, Ser. No. 7,507
10 Claims. (Cl. 317—234)

This application is a division of our application Serial No. 660,650, filed May 21, 1957, now abandoned.

This invention relates to a junction type semiconductor device, which is a transistor-like switch diode. The current-voltage characteristic of the device has three regions of high resistance, negative resistance and low resistance, respectively. The characteristics are also photosensitive so that the device may be triggered by either an optical or an electrical impulse.

A junction type semiconductor device according to this invention comprises at least three regions of semiconductors that is a p-n-(p) structure. One of the three regions is sandwiched by the other regions and the latter regions have electrodes connected thereto with ohmic contact. The outer regions are of substantially the same conducting type, but one of the outer regions has higher conductivity than the other.

It is an object of this invention to provide a semiconductor device having a negative resistance.

It is another object of this invention to provide such a device as having rapid switching action.

It is a further object of this invention to provide a semiconductor device having high photosensitive characteristics.

It is a still further object of this invention to provide a semiconductor device which is applicable instead of an ordinary discharge tube.

Other objects, features and advantages of this invention will be more fully apparent from the following detailed description given with the accompanying drawings, in which.

Figure 1:
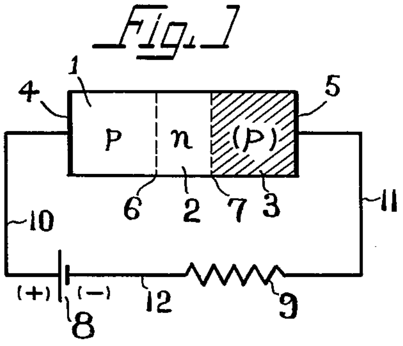
FIG. 1 is a schematic representation of the construction of a p-n-(p) junction type semiconductor device according to this invention, an external circuit being connected thereto.

Referring to the drawing, FIG. 1 shows schematically a construction and an external connection of a semiconductor device according to this invention. This device has three regions 1, 2 and 3 which are respectively p-type, n-type and (p)-type and two boundaries 6 and 7 which behave as p-n junctions. The former is a step junction, while the latter is a graded junction. The p-type and (p)-type regions have respectively electrodes 4 and 5 which are ohmic contacts and are respectively connected to one electrode of a source 8 and one end of a load 9 through lead wires 10 and 11, the other electrode of the source 8 and the other end of the load 9 being connected with a lead wire 12. In this case the electrode 4 is positively biased by the source 8 in respect to the electrode 5. The hatched region 3 is a p-type, containing acceptor impurity having higher ionization energy than ordinary group III element, for instance copper.

A method for making a germanium p-n-(p) structure suitable for the present device is as follows:

We choose copper and indium as acceptors and antimony as donor. Initially, a n-type germanium single crystal of approximately 2 ohm-cm. containing antimony is prepared. After being dipped in diluted aqueous solution of cupric nitrate and thereafter dried, this crystal is heated in inert gas in order to make copper atoms uniformly diffuse in germanium. By heating at 700° C. for about one hour, copper atoms of $3.6\times10^{15}$ cm.$^{-3}$ in concentration forms acceptor levels, resulting in changing into p-type one of 1.3 ohm-cm.

Figure 2:
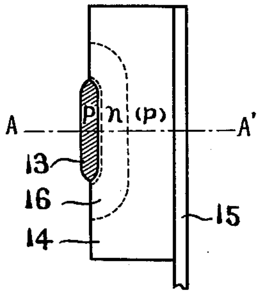
FIG. 2 shows one example of the devices according to this invention.

The crystal thus obtained was sliced into wafers and etched with an etchant as CP–4. And thereafter a dot of pure indium is attached on the surface of the wafer and then fused, heating for a few minutes in the hydrogen furnace of 550° C. Thereafter nonrectifying electrode was soldered to another surface of the wafer. FIG. 2 shows schematically a p-n-(p) structure of this device thus formed. That is, 13 designates an indium dot, 14 a germanium wafer and 15 a metallic electrode to which the wafer is electrically connected with ohmic contact. 16 shows a sandwiched n-type layer.

Figure 3:
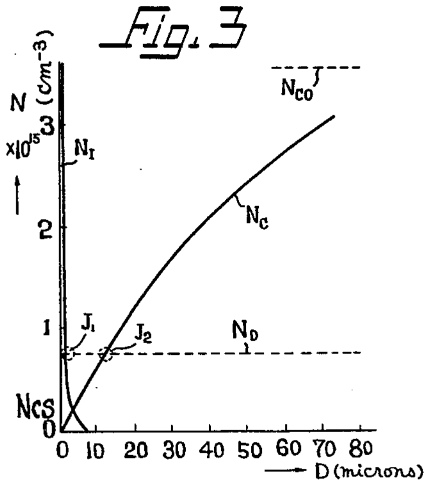
FIG. 3 shows concentration curves of impurity elements taken along A—A′ line of the semiconductor device shown in FIG. 2.

With heating process in the hydrogen furnace of 550° C., the reverse-diffusion of copper and the fusion of indium are carried out at the same time. FIG. 3 shows the impurity concentration N in cm.$^{-3}$ along A—A′ line can be approximately drawn as a function of the distance D in microns from the interface between germanium and indium, taking hereinafter described considerations. The fused indium forms a step p-n junction $J_1$ in the neighborhood of surface in the conventional way if the germanium is n-type. On the other hand, the behavior of copper having large diffusion coefficient in germanium is a little different. The concentration of copper $N_{cs}$ near the interface between germanium and indium is estimated from the distribution coefficient K′ of copper between germanium and germanium-indium-copper ternary melts $10^{-6}$. Since the atom fraction of copper in the melt is below $10^{-3}$, $N_{cs}$ is supposed to be under $10^{-9}$ atom fraction, if an equilibrium condition is established in the boundary. Therefore, $N_{cs}$ is understood to be below $10^{13}$ cm.$^{-3}$, which is much smaller in comparison with $3.6\times10^{15}$ cm.$^{-3}$ originally contained in the solid. If the system is heated long enough, the entire amount of copper in the solid is to be absorbed into the melt, resulting in the concentration of approximately $10^{13}$ cm.$^{-3}$. With heating shortly in the vicinity of 550° C., however, we could expect such a distribution of the copper concentration as is $N_{cs}$ at the surface and $N_{co}$ in the interior, drawn in FIG. 3, and the second p-n junction $J_2$ is formed rather inwards, where $N_D$ is the original concentration of antimony, $8\times10^{14}$ cm.$^{-3}$, and $N_I$ is that of indium. If the depth to which indium penetrates during heating is neglected and the diffusion of copper follows Fick's law, the distribution is given by the next, $$N_c=N_{co}-(N_{co}-N_{cs})\frac{2}{\sqrt{\pi}}\int_{x/2\sqrt{Dt}}^{\infty}e^{-\zeta}d\zeta$$

where $D.x$ and $t$ are respectively the diffusion coefficient of copper, the distance from the boundary and heating-on time. D is approximately $7\times10^{-8}$ cm.$^2$/sec. at 550° C. The thickness of the n-type layer obtained by this process is over the range from 10 to 20 microns. The thickness of the n-type layer and the specific resistivity of each region can easily be adjusted by changing amounts of original antimony and copper and heating-on time. Because of very small diffusion coefficient of the group V element at 550° C., there would be almost no change in original concentration of antimony. The substantially similar result can be obtained in this case by using such an alloy as lead-gallium, lead-aluminum, indium-gallium and indium-aluminum instead of indium and also such an impurity element as phosphorus, arsen and bismuth instead of antimony. Moreover, using tin or lead, though they are neutral impurity different from indium, it might absorb copper and make the small region around dot convert to the original n-type. Thus the second p-n junction $J_2$ is formed, while no p-n junction $J_1$ near the surface is recognized.

It will be clear that other well-known methods in the transistor technology can also be applied for making a p-n-p junction suitable for this invented device, if copper is used as one of acceptor impurities.

Figure 4:
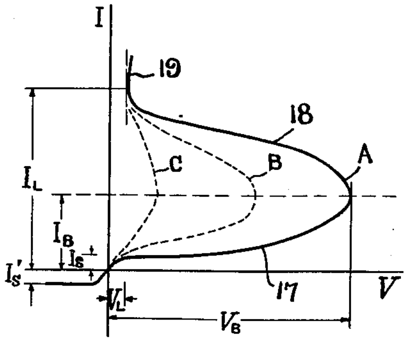
FIG. 4 illustrates typical characteristic curves of the semiconductor device according to this invention.

FIG. 4 is the characteristic of the semiconductor device according to this invention, where the abscissa and the ordinate represent respectively the applied voltage and the current. When the voltage is negatively applied, a small saturation current $I_s'$ flows. When the voltage is positive, as far as it is small, only another small saturation current $I_s$ flows. The device has a high resistance at this region 17. However the current increases gradually with the increase of the applied voltage and the curve bends up near $V_B$ and $I_B$ and turns over into the region 18 of negative resistance. Finally the curve reaches $V_L$ and $I_L$ and becomes the region 19 of very low resistance.

The observed values of $I_s'$, $I_s$, $V_B$, $I_B$, $V_L$ and $I_L$ over the temperature range from −20° C. to 37.5° C. for several specimens of this invented device, are listed in Table I.

*Table I*

| Specimen | Temp., ° C. | $I'_s$, μa. | $I_s$, μa. | $V_B$, volts | $I_B$, ma. | $V_L$, volts | $I_L$, ma. | $I_B/I_L$ |
|---|---|---|---|---|---|---|---|---|
| No. 105 | −20 | 5.3 | 1.5 | 42 | 1.7 | 0.42 | 4.8 | 0.35 |
| | 0 | 17.8 | 3.2 | 30 | 1.1 | 0.35 | 3.7 | 0.30 |
| | 12.5 | 28.0 | 10.2 | 29 | 1.1 | 0.31 | 3.2 | 0.34 |
| | 25 | 76.0 | 26.5 | 25 | 0.8 | 0.30 | 2.1 | 0.38 |
| | 37.5 | 164.0 | -------- | 12 | 0.7 | 0.26 | 2.5 | 0.24 |
| No. 106 | −20 | -------- | 1.4 | 57 | 1.8 | 0.35 | 3.7 | 0.49 |
| | 0 | -------- | 5.5 | 45 | 1.2 | 0.31 | 3.5 | 0.34 |
| | 12.5 | -------- | 11.2 | 34 | 0.9 | 0.29 | 2.8 | 0.32 |
| | 25 | -------- | 33.5 | 31 | 0.9 | 0.16 | 2.8 | 0.32 |
| | 37.5 | -------- | 100.0 | 19 | 0.8 | 0.22 | 2.3 | 0.35 |
| No. 107 | −20 | 8.8 | 7.0 | 32 | 2.3 | 0.47 | 6.3 | 0.37 |
| | 0 | 21.2 | 11.9 | 30 | 1.8 | 0.42 | 5.2 | 0.35 |
| | 12.5 | 29.0 | 21.6 | 24 | 1.5 | 0.39 | 3.8 | 0.39 |
| | 25 | 82.0 | 31.2 | 22 | 1.3 | 0.37 | 3.6 | 0.36 |
| | 37.5 | 166.0 | -------- | 20 | 1.2 | 0.36 | 4.0 | 0.30 |
| No. 108 | −20 | -------- | 1.1 | 34 | 1.9 | 0.43 | 6.0 | 0.32 |
| | 0 | -------- | 3.6 | 32 | 1.5 | 0.37 | 4.7 | 0.32 |
| | 12.5 | 34.0 | 8.4 | 31 | 1.3 | 0.33 | 4.2 | 0.31 |
| | 25 | 92.0 | 23.0 | 28.5 | 1.2 | 0.33 | 4.5 | 0.27 |
| | 37.5 | 254.0 | -------- | 25.5 | 1.0 | 0.28 | 4.0 | 0.25 |

The present current-controlled negative resistance can not be ascribed to such an effect of heating as is usually observed in the reverse direction of the point-contact diode, because the wattage of the product $I_L \cdot V_L$ is much less than the product $I_B \cdot V_B$ and moreover the transition from $V_B$ to $V_L$ and vice versa is finished within less than 1 microsecond. The curve A is observed in dark and is transformed to the curve B and C with increase of the intensity of an incident light.

The design theory of the junction transistor explains why this transistor-like diode device provides negative resistance. Let us consider that p-region, n-region and (p)-region are respectively equivalent to alloyed emitter, diffused base and collector, and discuss the following quantities:

(1) The collector junction current multiplication ratio $\alpha$ which results from the flow of holes out of the collector body might be approximately given by the next expression, $$\alpha \simeq \left(1 + b\frac{n_i^2}{p^2}\right)$$

where $b$: the mobility ratio $n_i$: the density of holes and of electrons in an intrinsic sample $p$: the density of holes in the vicinity of the junction inside of the collector.

In this device $p$ is approximately $10^{14}$ cm.$^{-3}$ at room temperature, and therefore $\alpha$ becomes 1.1.

(2) The low frequency current transport ratio across the base region $\beta$ should be determined by two terms, one due to surface recombination and the other to volume recombination. In the case of the alloyed emitter in our device, the former might be the major factor. Therefore $\beta$ would increase the enhance of the current for the sake of built-in accelerating field in relatively high resistivity base-region.

(3) The current emission ratio $\gamma$ at the emitter is $$1 > \gamma > 0.995$$

Applying a larger voltage V in comparison with $kT$ between the emitter and the collector, the flowing current I is given by $$I \simeq \frac{\text{constant}}{1-\alpha\beta\gamma} V^{1/3} \quad (1)$$

According to W. M. Webster's calculation published in Proceedings of the IRE, 42, 914 (1954), $\beta$ satisfies the following equation, when $\beta$ at $I=0$ is $\beta_0$, $$1-\beta_0 = \frac{1}{g(Z)}(1-\beta) \quad (2)$$

where $$Z = \frac{gWIb}{kTA6_n}$$

$$g(Z) \simeq \frac{1+Z/2}{1+Z}$$

and $kT/g = 0.026$ volt $W = 2\times10^{-3}$ cm. (base width)

$\sigma_n = 0.1$ ohm$^{-1}$ cm.$^{-1}$ (conductivity of base region)

$A = 7.1\times10^{-14}$ cm.$^2$ (cross-sectional area)

$b \sim 2$ (mobility ratio)

and therefore $$Z = 2\cdot10^3\cdot I$$

$g(Z)$ is a function called "the field factor" by Webster, but we used a slight different function from his in order to simplify the calculation.

From Eqs. 1 and 2, it is seen that current increases, subject only to limitation by circuit resistance, when I reaches $I_L$, the current corresponding to unity total alpha, that is $\alpha\beta\gamma=1$. From Eq. 2, $\beta$ for lower current than $I_L$ is igven by $$\beta = 1 - \frac{g(Z)}{g(Z_L)}(1-\beta_L)$$

Therefore $$1-\alpha\beta\gamma = \alpha\gamma\left(\frac{g(Z)}{g(Z_L)} - 1\right) = (\alpha\gamma - 1)\frac{Z_L - Z}{(1+Z)(2+Z_L)} \quad (3)$$

Figure 5:
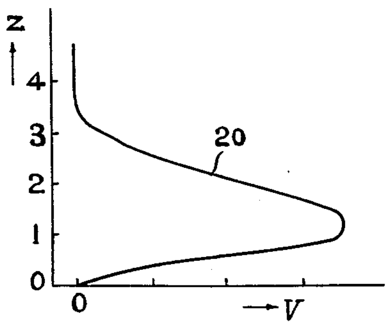
FIG. 5 is a calculated characteristic of the semiconductor device according to this invention.

From Eqs. 1 and 3, we obtain $$\left\{\frac{Z(Z_L-Z)}{1+Z}\right\}^3 = HV$$

where H is independent of both Z and V. When we take $I_L=2$ ma., that is $Z_L=4$, the above equation is plotted in FIG. 5, similar to the observed curve. The current $I_B$ at the breakdown voltage $V_B$ is given by the condition of $$\frac{dV}{dZ} = 0$$

that is $$Z = \sqrt{1+Z_L} - 1$$

When $Z_L=4$, $$Z=0.31 \cdot Z_L=1.24$$

Therefore $$I_{B/I_L}=0.31$$

which coincides approximately with the observed value in Table I.

The characteristic might depend upon temperature through, H, $\alpha$, $\beta$ and $\gamma$. Especially the temperature dependency of $\alpha$ determined by Eq. 1 would be rather important. In case of usual acceptors, $$\left(\frac{n_i}{p}\right)^2$$

might sharply decrease at low temperature. However, because of using Cu-diffused one of higher ionization energy than the group III element, the variation with temperature is considerably reduced in this device.

It will be understood that a desirable device can be made by choosing appropriate values of $\alpha$, $\beta$ and $\gamma$, according to the above analysis.

Figure 6:
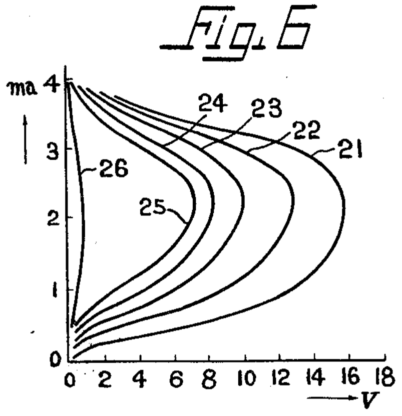
FIG. 6 shows photo-sensitivity curves of the semiconductor device according to this invention.

FIG. 6 shows photo-sensitivity of the semiconductor device according to this invention. The curve 21 is plotted in a dark room. The curves 22, 23, 24, 25, and 26 are respectively plotted in the light intensity of 100, 200, 300, 400 and 500 luxes. It will be observed that the photo-response is very rapid, because the (p)-type region of the device is short lifetime owing to dopping of copper.

The junction type semiconductor device according to this invention has many advantages, for example, as follows:

(1) It can be used as a switching element of a super miniature type, light in weight and small in power consumption.

(2) It can be used for a switching apparatus triggered with light because of excellent sensitivity and good response towards light.

(3) All usage similar to that of the usual discharge tube is possible.

(4) L-C resonant oscillator, R-C relaxation oscillator and etc., can be made with this device.

While we have explained a particular embodiment of our invention, it will be understood, of course, that we do not wish to be limited thereto since many modifications may be made and we, therefore, contemplate by the appended claims to cover any such modifications as are within the spirit and scope of our invention.

What is claimed is:

1. A junction type semiconductor device comprising three regions of semiconductors having carrier-forming impurities therein forming junctions therebetween, an inner one of said three regions being sandwiched between two side regions, and two electrodes respectively attached to said side regions to form a diode, both said side regions being of substantially the same conducting type but one of said side regions containing copper as a large diffusion coefficient acceptor, having relatively high resistance by comparison to the other side region, and forming a graded type junction with said inner region, the other of said side regions having a low diffusion coefficient impurity therein forming a stepped type junction with said inner region, whereby said diode device has characteristics so that a current passing through said two electrodes initially increases gradually with increase of the positive voltage applied across said two electrodes but finally bends at a certain value of the voltage and increases therefrom with decrease of the voltage so as to show a negative resistance characteristic.

2. A negative resistance, photo sensitive, diode comprising, a semiconductor body having first, second, and third regions having carrier-forming impurities therein forming junctions therebetween, said second region being disposed between, and being of opposite conductivity type from, said first and third regions to form first and second junctions at the interfaces between said first and second and said second and third regions respectively, said first region having an impurity of a low diffusion coefficient forming a stepped type junction with said second region, said third region containing a short lifetime and large diffusion coefficient impurity, having a resistance which is relatively high by comparison to that of said first region, and forming a graded type junction with said second region, a first ohmic contact to said first region, and a second ohmic contact to said third region, all providing a negative resistance across said contacts of said diode.

3. A negative resistance, photo sensitive, diode comprising, a body of group IV semiconductor material having first and third regions with carrier forming, group III impurities therein and a second region having carrier-forming, group V impurities therein between said first and third regions and forming junctions therewith, said first region having, as its dominant impurity, an impurity of a large diffusion coefficient forming a graded type junction, and said third region having, as its dominant impurity, an impurity of a relatively low diffusion coefficient and of a short lifetime in a relatively high concentration to give a relatively low resistance and providing a stepped type junction, and first and second ohmic contacts to said first and third regions respectively, all providing a negative resistance between said contacts.

4. A current controlled negative resistance diode comprising first and second, series connected, diode junctions of opposed polarities formed by three regions of semiconductor material each having carrier-forming impurities therein, a first and third of said regions being of a conductivity type opposite to that of the second of said regions, said first region having a connected contact and a concentration of a low diffusion coefficient impurity which is higher than that of said second region so that its resistance is lower than that of said second region and forming a relatively abrupt junction therewith and said third region having a connected contact and a concentration of a high diffusion coefficient impurity which is lower than that of said second region so that its resistance is higher than that of said second region and forming a relatively broad and graded type of junction therewith, whereby a current passing through the contacts of said diode initially increases gradually with increases of voltage and finally bends at a certain value of the voltage and thereafter increases with decreases of the voltage thus providing a negative resistance characteristic.

5. A negative resistance diode which is photo sensitive to incident light comprising at least three semiconductors having charge carriers therein and connected in series to provide at least two junctions of opposed polarity, one of said junctions of opposed polarity, one of said junctions being of the step and abrupt type and another of said junctions being of the high diffusion, graded, and relatively wide type to provide a negative resistance thereacross and for modulation thereof by light incident thereon.

6. A diode connected device comprising at least three regions of semiconductor having charge carriers therein and connected in series to provide at least two diode-like junctions of opposed polarities therebetween, one of said junctions being of the step type and the other being of the graded type, the current multiplication ratio of the graded type junction being of the order of greater than one, the current transport ratio across the intermediate region being of the order of less than one, and the mobility ratio being of the order of $2 \times 10^3$ times the current flowing through said diode device whereby it has a current controlled, negative resistance characteristic.

7. A diode connected device comprising first, second, and third regions of group IV semi-conductor having carrier-forming impurities therein and connected in series to provide diode-like junctions of opposed polarities therebetween, said second middle region having a group III impurity and said first and third outer regions having group V impurities therein, one of said outer regions having such an impurity of a low diffusion coefficient forming a stepped junction and the other of said outer regions having a lower, and higher resistance, concentration of such an impurity having a large diffusion coefficient forming a graded junction to provide a negative resistance characteristic for current flow through said diode device.

8. A junction type, diode device comprising at least three regions of semiconductor, one of said three regions being sandwiched by the other two side regions, said regions having impurities therein providing two junctions therebetween, and two electrodes respectively attached to said side regions, both side regions being of the same conductive type but one of said side regions containing copper as a highly diffused acceptor, having relatively high resistance and forming a graded type junction, the other of said side regions containing an impurity of a low diffusion coefficient, having a relatively low resistance and forming a stepped type junction, providing a diode having a positive and then a negative resistance for increasing values of current therethrough.

9. A diode comprising two electrodes having, in series, therebetween a first, p-n type junction which is broad and graded and a second, adjacent, and oppositely directed, p-n type junction which is abrupt and narrow relative to said first junction providing a current controlled, negative resistance characteristic.

10. A solid state diode including, in series, two adjacent and oppositely directed p-n type junctions of contrasting different widths and said diode having contrasting, different resistivities on the two outer sides of said two adjacent junctions with the outer side adjacent the wider junction having the higher resistance, all providing a negative resistance for a range of increasing currents through said two adjacent junctions.

References Cited in the file of this patent

UNITED STATES PATENTS

| | | |
|---|---|---|
| 2,701,326 | Pfann | Feb. 1, 1955 |
| 2,772,360 | Shockley | Nov. 27, 1956 |
| 2,781,481 | Armstrong | Feb. 12, 1957 |
| 2,793,145 | Clarke | May 21, 1957 |
| 2,794,917 | Shockley | June 4, 1957 |
| 2,813,233 | Shockley | Nov. 12, 1957 |
| 2,836,521 | Longini | May 27, 1958 |
| 2,836,523 | Fuller | May 27, 1958 |
| 2,840,497 | Longini | June 24, 1958 |
| 2,850,413 | Sehmich | Sept. 2, 1958 |
| 2,854,366 | Wannlund et al. | Sept. 30, 1958 |
| 2,861,226 | Lootens | Nov. 18, 1958 |
| 2,940,022 | Pankove | June 7, 1960 |
| 2,997,604 | Shockley | Aug. 22, 1961 |

FOREIGN PATENTS

| | | |
|---|---|---|
| 779,666 | Great Britain | July 24, 1957 |